United States Patent [19]

Fan

[11] Patent Number: 4,567,062

[45] Date of Patent: Jan. 28, 1986

[54] PROCESS FOR PHOTOFORMED PLASTIC MULTISTRATE USING TWO LAYER FILM

[75] Inventor: Roxy N. Fan, E. Brunswick, N.J.

[73] Assignee: E. I. Du Pont de Nemours and Company, Wilmington, Del.

[21] Appl. No.: 665,002

[22] Filed: Oct. 26, 1984

[51] Int. Cl.$^4$ ............................................. H05K 3/18
[52] U.S. Cl. .................................... 427/96; 427/436; 430/315; 430/319
[58] Field of Search ............... 430/291, 313, 319, 198; 427/96, 436

[56] References Cited

U.S. PATENT DOCUMENTS

| | | | |
|---|---|---|---|
| 4,157,407 | 6/1979 | Peiffer | 427/54 |
| 4,329,620 | 9/1982 | Cyr et al. | 430/259 |
| 4,360,570 | 11/1982 | Andreades et al. | 430/319 |
| 4,454,168 | 6/1984 | Fritz | 430/291 |

*Primary Examiner*—John L. Goodrow

[57] ABSTRACT

Process for preparing multilayer printed circuits comprising laminating simultaneously or sequentially to a substrate bearing a circuit pattern two photopolymerizable layers, the lower layer formulated for bulk response as defined and the upper layer formulated for surface response as defined; exposing the laminate to actinic radiation through a circuit image related to the circuit pattern on the substrate; embedding finely divided metal, e.g., copper, to the tacky image areas; exposing the toned laminate to actinic radiation through an image of at least one overlying segment of the conductive circuit pattern; removing unexposed photopolymer from the two layers to form vias; embedding finely divided metal, e.g., copper, or catalyst to the side walls of the vias; optionally, curing the image by exposing to actinic radiation and/or by heating; plating to form an interconnected electrically conductive circuit. Additional circuit layers can be added by repeating the process using the newly plated circuit pattern as a substrate.

9 Claims, 7 Drawing Figures

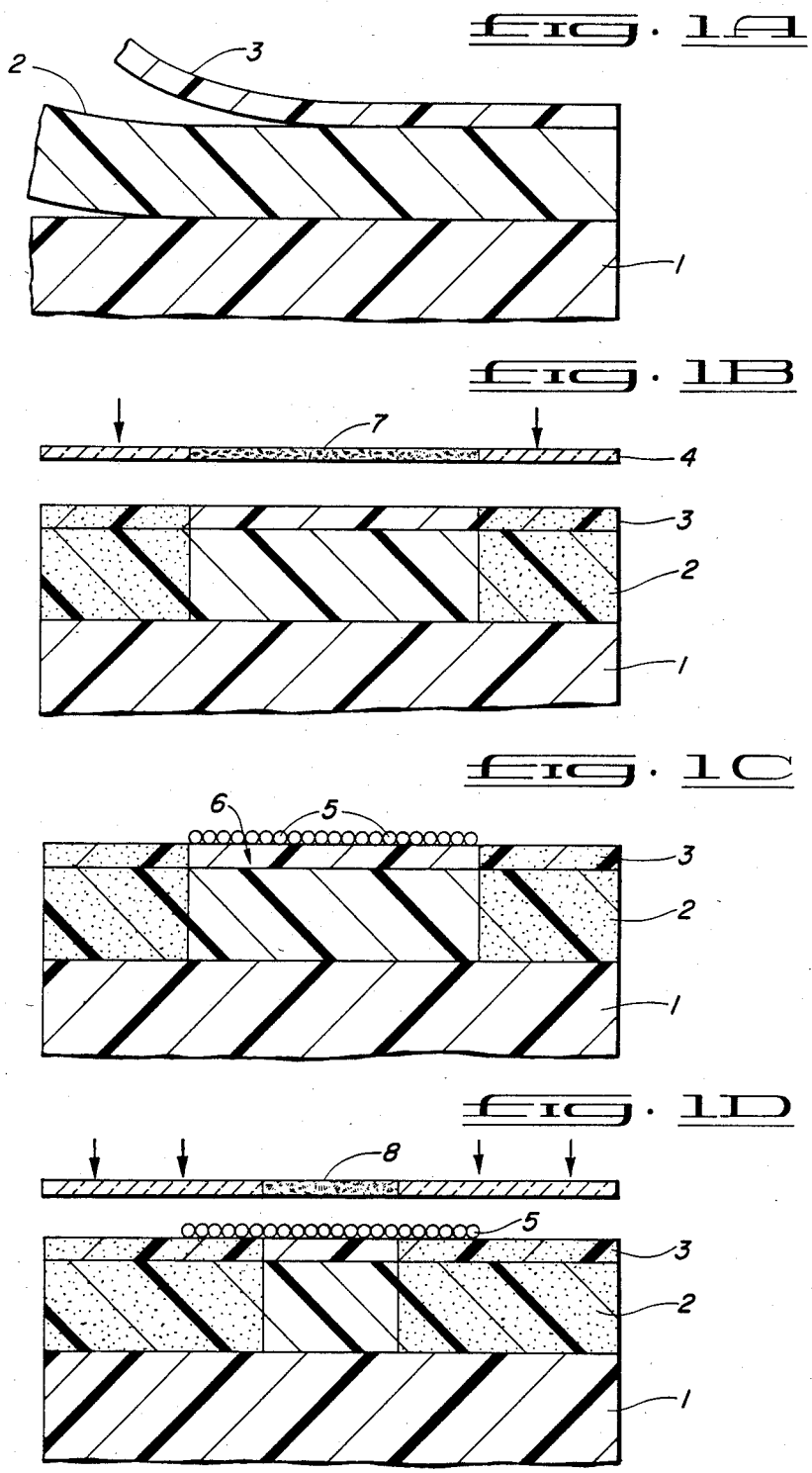

PROCESS FOR PHOTOFORMED PLASTIC MULTISTRATE USING TWO LAYER FILM

TECHNICAL FIELD

This invention relates to a process for preparing multilayer printed circuits. More particularly this invention relates to a process for preparing multilayer printed circuits utilizing two photopolymerizable layers having different physical properties.

BACKGROUND ART

The preparation of printed circuits, including multilayer printed circuits is known. Powdered materials such as particulate metals have been applied to surfaces having imagewise tacky and nontacky areas by a number of toning methods to produce printed circuit patterns. Representative methods are disclosed in Peiffer, U.S. Pat. Nos. 4,054,479, 4,054,483 and 4,157,407. After the particulate metal is applied to the tacky image areas and unwanted particles are removed, e.g., mechanically, from the nontacky image areas, the circuit is formed by one of several additive techniques including fusion of metal particles, electroless plating, etc. The printed circuits formed by these additive processes are useful, but the processes have certain disadvantages.

Peiffer U.S. Pat. No. 4,157,407 is an improvement over the earlier Peiffer Pat. Nos. 4,054,479 and 4,054,483 wherein conductive interconnections between layers are produced by predrilling holes and registering the holes with the printed circuit patterns. Such predrilling procedures are limited by inherent inaccuracies of registration to printed circuit patterns where circuit lines are not closely spaced. Peiffer U.S. Pat. No. 4,157,407 in its process for preparing printed circuits applies a single layer of a photoadhesive, e.g., photopolymerizable composition, to a substrate bearing an electrically conductive circuit pattern. The photoadhesive layer in order to be suitable for the preparation of a printed circuit must be capable of toning in tacky areas without toning in the background areas. The photoadhesive layer also must possess good development latitude with a solvent therefor, adhere metal powder on its surface and in the vias, and maintain adherence to its substrate through all the steps of preparing a circuit including solvent development and plating. It is difficult to formulate an element having a single photoadhesive layer which provides good properties under all conditions in preparing the printed circuit.

There is a need for a process for preparing multilayer printed circuits which have good surface (toning) response as well as good development and other physical properties.

BRIEF DESCRIPTION OF THE DRAWINGS

In the accompanying Figures forming a material part of this disclosure wherein the Figures are a schematic view in cross section of a photopolymerizable element:

FIG. 1A illustrates the lamination to a substrate (1), bearing a circuit pattern (not shown) or having an electrically conductive surface, two photohardenable layers, lower layer (2) and upper layer (3) which possess different properties as described below.

FIG. 1B illustrates the imagewise exposure of the laminate to actinic radiation through a circuit image (4) which is related to the underlying circuit pattern, if present.

FIG. 1C illustrates the application of finely divided metal, alloy or plating catalyst (5) to the tacky image areas (6) corresponding to the nontransparent areas (7) of the circuit image (4).

FIG. 1D illustrates exposing the toned laminate for a second time, i.e., through an image (8) of at least one overlying segment of the conductive circuit pattern (via target).

DISCLOSURE OF THE INVENTION

Figure 1E:
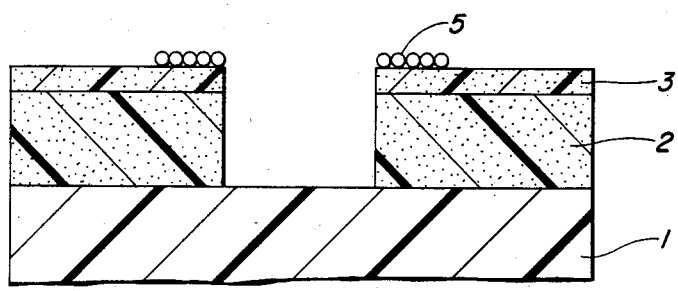
FIG. 1E illustrates the formation of a via (9) by removal of the unexposed areas of the photopolymerizable layers (2) and (3) with a solvent therefor (vertical sides only shown).

In accordance with this invention there is provided a process for preparing two layer printed circuits having conductive interconnections which comprises (a) laminating simultaneously or sequentially to a substrate bearing a circuit pattern two photopolymerizable layers, a tacky lower layer (1), 0.0005 to 0.010 inch (0.013 to 0.254 mm) in thickness, formulated for bulk response comprising an elastomeric polymeric binder having a Tg of −10° C. or lower, an ethylenically unsaturated monomeric compound, and a photoinitiator or photoinitiator system, and a tacky upper layer (2) thinner than lower layer (1) and having a maximum thickness of 0.0005 inch (0.013 mm), tacky upper layer (2) formulated for surface response having an optical density in the range of 0.3 to 1.5 in at least a portion of the actinic spectral region, comprising a nonelastomeric polymeric binder, an ethylenically unsaturated monomeric compound which is the same or different from the monomeric compound in layer (1), and a photoinitiator or photoinitiator system which is the same or different from the photoinitiator or photoinitiator system in lower layer (1);

(b) exposing the laminate to actinic radiation through a registered circuit image which is related to the underlying circuit pattern having at least one segment thereof overlying at least one segment of the conductive circuit pattern wherein the unexposed areas of upper layer (2) remain tacky and the exposed areas of upper layer (2) become nontacky;

(c) embedding finely divided metal, alloy, or plating catalyst to the unexposed areas;

(d) optionally heating the metallized or catalyzed laminate;

(e) exposing the metallized or catalyzed laminate to actinic radiation through a registered via image of at least one overlying segment of the conductive circuit pattern;

(f) removing the unexposed areas of the photopolymerizable layers with a solvent therefor to form vias through layers (1) and (2), the sides of the vias corresponding to exposed layer (1) remaining tacky, whereby segments of the underlying circuit patterns are uncovered;

(g) embedding finely divided metal, alloy or plating catalyst material to the vias, the metal or catalyst being embedded into the sides of the vias;

(h) optionally curing the laminate by exposing the laminate to actinic radiation, and/or heating;

(i) plating electrolessly the metallized or catalyzed vias, the uncovered segments, and overlying circuit image to form an electrically conductive circuit pattern interconnected with electrically conductive vias.

A multilayer printed circuit board having conductive interconnections can be prepared from a two layer printed circuit which has been prepared utilizing steps (a), (b), (c), (e), (f), (g) and (i) as described above and either or both of the optional steps (d) and (h) and then repeating the required steps as well as any of the optional steps at least once using the newly plated circuit pattern in step (i) for the succeeding process step (a).

The printed circuit substrate employed in the present invention can be any one of the various kinds of sheets, plates, synthetic resin plates, synthetic resin laminated plates, or composites, etc., having the necessary electrical and mechanical properties, chemical resistance, heat resistance, etc. Examples of resins include: phenol-formaldehyde, epoxy and melamine resins, etc. Glass plates and ceramic or ceramic coated metal plates are also useful. The substrate can also be a paper, cardboard, fiber, including glass cloth, wooden sheet material or paper base phenolic resin laminate. Paper base without resin is particularly useful in producing low-cost printed circuits. Metal sheets can be used provided that the material adhered thereto acts as an insulating barrier between the metal sheet support and the buildup metallized circuit. Also useful are self-supported photohardenable elements as disclosed in Peiffer U.S. Pat. No. 4,054,479. The printed circuit substrate can have on its surface a conductive metal layer, e.g., copper, which is often referred to as a ground plane. A printed circuit pattern which can contain closely spaced lines can be present on the printed circuit substrate. The printed circuit pattern can be prepared by standard methods known in the art, e.g., etching of copper on the surface of the substrate or by other methods such as those described in Peiffer U.S. Pat. No. 4,234,626 and Haney and Lott U.S. Pat. No. 4,411,980.

To form printed circuit boards with conductive interconnections according to the invention to the printed circuit substrate bearing a circuit pattern or having an electrically conductive surface (ground plane) are laminated two tacky photopolymerizable layers. The laminations can be performed simultaneously or sequentially as is known to those skilled in the art. The lamination can be done at elevated temperature provided the temperature is below the degradation temperature of the particular photopolymerizable layers. Lamination procedures are described in Celeste U.S. Pat. No. 3,469,982, Collier and Pilette U.S. Pat. No. 3,984,244 and Friel U.S. Pat. No. 4,127,436. These patents are incorporated herein by reference. The two layers range in thickness from 0.00005 to 0.0005 inch (0.0013 to 0.013 mm), preferably 0.0001 to 0.00025 inch (0.0025 to 0.0064 mm), for the upper layer and 0.00050 to 0.010 inch (0.013 to 0.254 mm), preferably 0.001 to 0.005 inch (0.025 to 0.127 mm), for the lower layer adhered to the printed circuit board. The upper layer is substantially thinner than the lower layer. The ratio of the thickness of the lower layer to the upper layer is at least 2 to 1 and no greater than about 200 to 1, preferably no greater than about 15 to 1. The combined thicknesses of the two layers is between 0.00055 to 0.0105 inch (0.014 to 0.267 mm). Prior to lamination the photopolymerizable layers are present between a removable film support and a removable protective cover sheet. The film support, e.g., polyethylene terephthalate, polyimides, etc., have low to moderate adherence to the photopolymerizable layer and can be removed, e.g., at normal room temperature, without damaging the layer. The photopolymerizable layer has less adherence to the protective cover sheet than it does to the removable film support. The photopolymerizable layer has less adherence to the removable film support than it has to the surface to which it is applied, i.e., printed circuit substrate. Typical protective cover sheets include: polyolefins, silicone-treated polyethylene terephthalate, fluoronated polymeric materials, etc.

The two photopolymerizable layers differ in their composition so as to provide different desired properties. The upper layer is formulated to provide improved surface response. "Surface response" as used through the specification means toner or catalyst material adheres in unexposed areas while substantially no toner or catalyst material adheres in the exposed background areas. Good fine line resolution is achieved with good edge definition and thus high contrast property is attained for toning. The lower layer is formulated to provide improved bulk response. "Bulk response" as used throughout the specification means good solvent development latitude, good toner acceptance on the via walls (including after exposure and development), good adhesion to the printed circuit substrate, and good electrical and thermal properties as a permanent dielectric layer. Each layer contains the normal ingredients of a photopolymerizable layer, i.e., polymeric binder, ethylenically unsaturated compound and photoinitiator or photoinitiator system. The differences in composition and weight percentages are discussed more fully below. Optical brighteners, fillers, etc. are optional additives that can be present.

The upper photopolymerizable layer, in order to provide proper surface response, has an optical density in at least a portion of the actinic spectral region in the range of 0.3 to 1.5, preferably about 0.9, contains about 10 to 90 percent by weight monomer or mixture of monomers which may be the same or different from the monomer present in the lower layer (1); is as thin as practical; contains the same or different initiator or initiator system present in the lower layer (1); and contains no elastomeric binder(s). Suitable monomeric compounds include those compounds disclosed in Fickes and Rakoczy U.S. Pat. No. 4,400,460, column 3, line 48 to columm 5, line 4, and Haney and Lott U.S. Pat. No. 4,411,980, column 4, lines 10 to 65. The disclosures of these patents and the patents cited therein are incorporated herein by reference. Nonelastomeric polymer binders generally having a Tg above 15° C., preferably above 25° C. (10 to 90 percent by weight) include those compounds disclosed in Haney and Lott U.S. Pat. No. 4,411,980, column 5, line 46 to column 6, line 7, the disclosure of which is incorporated herein by reference. The photoinitiator or photoinitiator system (0.2 to 10 percent by weight) includes any of those compounds disclosed in Notley U.S. Pat. No. 2,951,752, Chambers U.S. Pat. No. 3,479,185, Chang and Fan U.S. Pat. No. 3,549,367, Fan U.S. Pat. No. 3,558,322, Cescon U.S. Pat. No. 3,615,454, Grubb U.S. Pat. No. 3,647,467, Baum and Henry U.S. Pat. No. 3,652,275, Chang U.S. Pat. No. 3,661,558, Strilko U.S. Pat. No. 3,697,280, Chang U.S. Pat. No. 3,926,643, Dessauer U.S. Pat. No. 4,311,783, Sysak U.S. Pat. No. 4,341,860, etc. To provide the requisite optical density ultraviolet absorbers, ultraviolet brighteners, initiators with absorption in the ultraviolet region of the spectrum or colorants can be present in the upper layer as known to those skilled in the art. The percentages by weight are based on the total weight of the upper layer.

The lower photopolymerizable layer (1), in order to provide proper bulk response, contains at least one elastomeric or rubber filled binder having a Tg of −10° C. or lower, or impact modifier which renders the lower layer adherent to toner or catalyst material (unexposed as well as exposed areas); and contains at least one monomeric compound such as highly viscous "glass-like" monomers, e.g., modified epoxy diacrylate or dimethacrylate resins, and the other monomers disclosed in Fickes and Rakoczy U.S. Pat. No. 4,400,460 and Haney and Lott U.S. Pat. No. 4,411,980, the disclosures of which have been referred to above. Elastomeric polymeric binders present in the lower layer include: rubber type polymers, both natural and synthetic, e.g., polyisobutylene, Thiokol A, butyl rubber, chlorinated rubbers, poly(vinylisobutylether), polymers of butadiene, isoprene and random, teleblock and block copolymers, terpolymers or higher polymers, e.g., butadiene copolymerized with styrene, isoprene, neoprene and acrylonitrile, nitrile rubbers, e.g., butadiene/acrylonitrile acrylonitrile/butadiene carboxy-modified, acrylonitrile/butadiene/styrene. alkyl (1 to 4 carbon atoms) acrylate or methacrylate/acrylonitrile/butadiene interpolymers, silicone elastomers, acrylic containing elastomers, etc. in various proportions. The lower layer (1) contains 0.2 to 10 percent by weight of an initiator or initiator system disclosed in any of the above-listed United States patents described as initiators or initiator systems for upper layer (2). The ratio of monomeric compound to elastomeric binder is dependent on several factors including the types of monomeric compounds and elastomeric binders used and the molecular weights, particularly of the binder. The percentages by weight are based on the total weight of the lower layer.

Optical brighteners which can be present in the photopolymerizable compositions are disclosed in Held U.S. Pat. No. 3,854,950, column 2, line 67 to column 3, line 41 and column 4, lines 25 to 42, the dislosures of which are incorporated herein by reference. Fillers which can be present in the bulk response photopolymerizable compositions are disclosed in Celeste and Bauer U.S. Pat. No. 3,261,696, column 4, lines 43 to 52, and Cohen and Lazaridis U.S. Pat. No. 4,414,278, the disclosures of which are incorporated herein by reference.

The two-layer laminate as described above is exposed to a source of actinic radiation through a registered image of a circuit which is related to the underlying circuit pattern if one is present. At least one segment of the circuit image overlaps at least one segment of the underlying circuit pattern.

The source providing actinic radiation for imagewise exposure is known to those skilled in the art and are rich in ultraviolet radiation. Suitable sources are disclosed in Plambeck U.S. Pat. No. 2,760,863, Chu and Cohen U.S. Pat. No. 3,649,268, Peiffer U.S. Pat. No. 4,157,407 and Haney and Lott U.S. Pat. No. 4,411,980, the disclosures of which are incorporated herein by reference.

Finely divided metal, alloy, or plating catalyst is applied to the tacky image areas and becomes embedded therein. This is done generally by applying, e.g., with pressure, the metal or plating catalyst particles over the entire exposed surface and removing the particles in the nonadherent or nontacky areas. Suitable particles include: copper, tin, lead, solder, mixtures of copper and solder, copper-tin alloy, tin-lead alloy, aluminum, gold, silver; metal oxides such as titanous oxide, copper oxide, etc. Also useful are metal coated particles, e.g., silver coated glass. The particles have an average diameter of 0.5 to 250 μm, preferably 1.0 to 25 μm, in average diameter. Copper powder is preferred.

The particles can be applied (embedded) by known methods including, but not limited to, the toning methods described in Burg and Cohen U.S. Pat. No. 3,060,024, Chu and Cohen U.S. Pat. No. 3,649,268 and Tobias U.S. Pat. No. 4,069,791. It is also possible to apply the particles by use of a fluidized bed of particles as described in Research Disclosure, June 1977, No. 15882 by Peiffer and Woodruff. Optionally the adherence of the particles to the image surface may be improved by tackifying the image areas, e.g., by heat from an infrared heater. This may be accomplished during the application of the particles. Removal of excess metal, alloy or plating catalyst particles from nonadherent areas, if necessary, is described in the above-identified United States patents and the Research Disclosure, the disclosures of which are incorporated by reference.

The metallized or catalyzed laminate is then exposed to a similar source of actinic radiation described above through a registered via image of at least one overlying segment of the conductive circuit pattern, and the unexposed areas of the two photopolymerizable layers are removed with a solvent therefor to form vias having side walls. Preferably a single solvent is used to remove unexposed areas in the two layers, but if necessary, two different solvents, one for each layer may be used. Typical solvents include: 1,1,1-trichloroethane, perchloroethylene, perchloroethylene and n-butanol, 1,1,1-trichloroethane and n-butanol, butyl and ethyl Cellosolve ®, butyl Carbitol ® and 1,1,1-trichloroethane and derivatives thereof, various alcohols, e.g., methanol, ethanol, propanol, isopropanol, etc. and 1,1,1-trichloroethane, etc. These and other useful solvents are described in the patents which disclose the particular photoadhesive compositions.

Finely divided metal, alloy or plating catalyst of the type described above is applied to the vias, the metal or catalyst adhering to the side walls of the vias.

At this time another optional step but one which is preferably used is the curing of the circuit board by exposing the circuit board to overall ultraviolet radiation, e.g., from a radiation source as described above or other ultraviolet radiation curing unit, e.g., in the range of 0.1 to 10 minutes, and/or by heating, e.g., at a temperature up to 150° C. for at least 10 seconds. The curing step, when used, can occur simultaneously with the application of the metal, alloy or plating catalyst particles and/or subsequent thereto. It is important that the duration and/or temperature used in the curing step be limited to prevent any substantial degradation of the photopolymerized element.

Electroless plating procedures are known to those skilled in the art, e.g., U.S. Pat. No. 4,054,483 which is incorporated by reference. Electroless plating baths are commercially available, e.g., from the Shipley Company, Revere, MA, Kollmorgen Corp., Glen Cover, N.Y., and other sources. The metal-bearing circuit board is maintained in the bath for a sufficient period of time, e.g., 1 to 6 hours, preferably 1 to 4 hours. Useful electroless plating solutions are described in the examples below, Zeblisky et al., U.S. Pat. No. 3,095,309, particularly Example II, which is incorporated by reference. The temperature of the electroless plating bath can range from 43° to 85° C., preferably 53° C.

A preferred embodiment of the invention is illustrated in Example 2 below.

INDUSTRIAL APPLICABILITY

The process of the invention enables two or more layered printed circuits with electrical interconnections to be prepared without drilling or punching the requisite hole and without chemical catalyzation of the through-holes which is time consuming. The printed circuits are prepared with substantially no extraneous plating in the background areas. There is provided by the process a wider latitude for formulation of the circuits due to the separation of the surface response (no background toner) of the upper photopolymerizable layer from the bulk response of the lower photopolymerizable layer (development latitude for via formation, toner acceptance for exposed and developed via walls, and physical properties).

EXAMPLES

This invention is illustrated by the following examples wherein the parts and percentages are by weight. The molecular weights of polymeric compounds are weight average molecular weight ($\overline{M}_w$). The $\overline{M}_w$ of the polymer can be determined by using a light scattering technique using known standard sample, e.g., polystyrene, polymethacrylic acid, polymethylmethacrylate, etc., as shown to those skilled in the art.

EXAMPLE 1

A double-sided copper printed circuit laminate (1 ounce (2.8 g) copper on each side) referred to in the trade as a ground plane was cut to the size 6 inch × 6 inch (15.2 cm × 15.2 cm) and the copper surfaces on both sides were mechanically scrubbed with a Somaca®LD printed circuit brush (trademark 3M Co., St. Paul, MN). The scrubbed circuit board was immersed in a solution prepared as follows:
(a) to 2500 g distilled water,
(b) add concentrated hydrochloric acid, 380 g,
(c) add benzotriazole, 376.6 g, and
(d) bring total to 3800 g with distilled water, and then
(e) dilute 1 part to 9 parts of distilled water.

The treated circuit board was placed in a rinse water tank for 3 minutes followed by rinsing the board for about 30 seconds with distilled water. After the board was allowed to dry it was baked in an oven for about 15 minutes at 150° C. A polyethylene terephthalate film treated on one side with 16,250 release by Custom Coating and Laminating Corp., Worcester, MA (not shown in FIG. 1A) bearing a photosensitive layer (2 in FIG. 1A), about 0.0020 inch (0.05 mm) in thickness of the below-listed composition was laminated to the baked circuit board (1 in FIG. 1A) at 2 feet/minute (0.61 m/minute) at about 103° C. in a Riston ®HRL-24 Laminator manufactured by E. I. du Pont de Nemours and Company, Wilmington, DE.

| Ingredient | Amount (parts) |
| --- | --- |
| Methyl methacrylate(46)/acrylonitrile(9)/ | 14.59 |
| butadiene(14)/styrene(31) resin | |
| Polymethylmethacrylate, inherent viscosity of 0.50 | 5.98 |
| Rubber [3% carboxy-modified acrylonitrile(27)/butadiene(73)] high molecular weight, average Mooney viscosity is 45 | 12.72 |
| Pentaerythritol triacrylate | 19.29 |
| Di(3-acryloxy-2-hydroxypropyl)-ether of bisphenol-A | 19.29 |
| 4-chlorobenzophenone | 4.64 |
| Michler's ketone | 0.32 |
| Green pigment[1] | 0.09 |
| Polyethylene covered talc | 23.08 |

[1] Monastral Green ® (pigment 30%) rollmill blended with methylmethacrylate(34)/styrene(42)/acrylonitrile(8)/butadiene(16) interpolymer The protective polyethylene terephthalate film (not shown in FIG. 1A) was removed from the photosensitive layer and a second photosensitive element, 0.0005 inch (0.013 mm) thick electron discharge treated (0.07 coulomb/ft$^2$) polyethylene terephthalate film (not shown in FIG. 1A) bearing a photosensitive layer (3 in FIG. 1A), about 0.00015 inch (0.0038 mm) in thickness of the below-listed composition was laminated to the first laminated layer at the same conditions described above except that the lamination temperature was room temperature.

| Ingredient | Amount (parts) |
| --- | --- |
| 1 Di-(3-methacryloxy-2-hydroxypropyl)-ether of bisphenol-A | 52.0 |
| 2 Polymethylmethacrylate, high molecular weight, inherent viscosity 1.25 | 41.4 |
| 3 (2-o-chlorophenyl-4,5-diphenyl imidazolyl) dimer | 2.2 |
| 4 2-(stilbyl-4")-(naphtho-1',2'2':4,5)-1,2,3-triazole-2"-sulfonic acid phenyl ester | 2.2 |
| 5 2-Mercaptobenzoxazole | 1.5 |
| 6 Polyethylene oxide, $M_w$ is 600,000 | 0.7 |

After standing overnight the laminate described above was exposed through a positive circuit line image (4) in FIG. 1B using a Riston®PC-24 light source manufactured by E. I. du Pont de Nemours and Company having a power of 5 kw and at a 10 unit setting while under vacuum. After removal of the electron discharge-treated polyethylene terephthalate film (not shown in FIG. 1A) the exposed laminate was cascade toned four cycles with copper powder, median particle size 1 μm. The excess copper powder in background areas was washed with wet towels for 10 cycles and allowed to air dry. As shown in FIG. 1C, the copper powder (5) was retained in the tacky image areas (6), corresponding to opaque areas (7) of the circuit line image (4) shown in FIG. 1B.

Figure 1F:
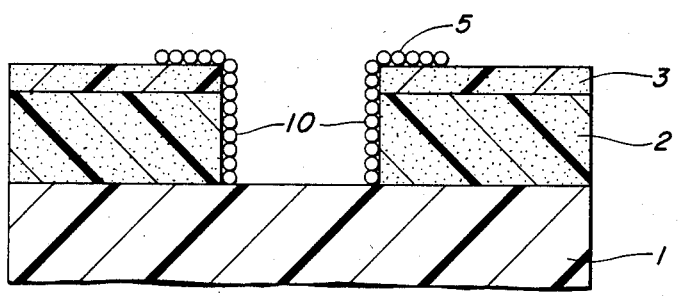
FIG. 1F illustrates the application of finely divided metal, alloy or plating catalyst (5) to the vias, the metal or catalyst adhering to the side walls of the via (10) (shown only on the vertical side walls).

The copper toned element was exposed through a via target (8 in FIG. 1D) in register with the toned image as described above except that the exposure in the exposure device was for 80 units. The reexposed element was developed for 90 seconds in methyl chloroform using a Riston ® Model C Processor manufactured by E. I. du Pont de Nemours and Company, Inc., Wilmington, DE to remove the copper powder and photopolymerizable material down to the ground plane only in the areas which were not exposed to the actinic radiation. (The via is shown as 9 in FIG. 1E.) The developed element was pad toned using a mohair pad containing copper powder described above. The excess copper powder was removed by being wet towel wiped for 10 cycles. Copper powder was found to adhere to the via walls (10 in FIG. 1F). The element was then ultraviolet radiation cured using an Argus International PC-7100 Ultraviolet Processor at 10 feet/minute (~3.05 m/minute) speed setting. The cured element was baked in an oven at 150° C. for 2 hours. A control element was prepared as described above except that only the thicker lower photopolymerizable layer was present, and the element was imagewise exposed through the positive circuit line image at a 15 unit setting.

Figure 1G:
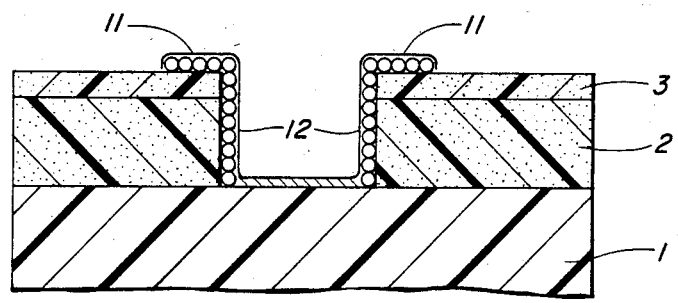
FIG. 1G illustrates plating the metallized or catalyzed vias (vertical sides only shown) and underlying surface or circuit pattern to form an electrically conductive circuit pattern (11) interconnected with an electrically conductive via (12) and underlying conductive surface.

The two toned elements were degreased by washing with a warm soapy solution of pH about 9 followed by a warm water rinse and the toned elements were allowed to cool. The toned elements were immersed for 20 seconds into 15% sulfuric acid solution, followed by a rinse in a water tank and a distilled water tank each for 30 seconds. The rinsed toned elements were placed immediately into a copper electroless plating bath purchased from Photocircuits Kollmorgen, Glen Cove, N.Y. designated PCK AP-480 (referred to as additive plating bath 480, electroless copper addition technology) and maintained in the plating bath for 2 hours. The electrolessly plated circuit (11 in FIG. 1G) interconnected with an electrically conductive via (12 in FIG. 1G) and underlying conductive surface, and the control circuit were rinsed in water for 1 minute, immersed for 3 minutes in the benzotriazole solution described above, rinsed again in water and dried. The two circuits were baked for 1 hour at 150° C., cooled and tested.

The control element gave severe extraneous plating in the background and poor fine line images. The two layer element of the invention was substantially free of extraneous plating and gave good fine line resolution. The extraneous plating can cause shorts and limit the fine line resolution capability.

EXAMPLE 2

Example 1 was repeated except for the following alterations: in the preparation of the two-layer laminate the electron discharge treated polyethylene terephthalate film was discarded and replaced by a 0.001 with (0.025 mm) silicone-release polyethylene terephthalate film before exposure. Both elements received an initial imagewise exposure through the positive circuit line image at a 15 unit setting and were toned with Cerac ® copper powder (Lot No. 4251) spherical particles having median size of about 2.85 μm made from atomized melt).

The two layer element of the invention was essentially free of extraneous plating giving excellent fine line resolution while the control gave severe extraneous plating and had severe shorting in the fine lines and the spaces therebetween. This example demonstrates that the element of the invention gives dramatic improvement in both extraneous plating and fine line resolution even though larger particle size copper powder is used as plating catalyst.

EXAMPLE 3

The Example 1 procedure was repeated except that the thick lower (bulk) layer had the following composition:

| Ingredient | Amount (parts) |
| --- | --- |
| Polymethylmethacrylate, inherent viscosity of 0.50 | 5.60 |
| Rubber [3% carboxy-modified acrylonitrile(27)/butadiene(73)] high molecular weight average Mooney viscosity is 45 | 2.30 |
| Di-(3-acryloxy-2-hydroxypropyl)-ether of bisphenol-A | 24.40 |
| 4-chlorobenzophenone | 5.40 |
| Michler's ketone | 0.30 |
| Green pigment described in bottom layer of Example 1 element | 0.10 |
| Methylmethacrylate/butadiene/styrene terpolymer[1] | 13.40 |
| Copolymer of epichlorohydrin and ethylene oxide | 12.50 |
| Trimethylolpropane triacrylate | 4.60 |
| Tripropylene glycol diacrylate | 3.50 |
| Harwick #71 Clay[2] | 27.85 |

[1]white free flowing powder having a maximum of 0.3% volatiles; particle size distribution of maximum 10% on 45 mesh screen, maximum 10% through 325 mesh screen; specific gravity 1.0, sold under the trademark Acryloid ® KMBTA-III-F byRohm and Haas, Philadelphia, PA.
[2]high brightness clay having a chemical composition: $SiO_2$ (45.5%), $Al_2O_3$ (38.3%), $Fe_2O_3$ (0.3%), $TiO_2$ (1.5%), CaO (0.1%) $Na_2O$ (0.1%), $K_2O$ (trace), specific gravity of 2.58, average particle size 0.55 μm, oil absorption (ASTM D281-31) of 37 to 41, refractive index 1.56, pH 6.5 to 7.5 sold by Harwick Chemical Corp., Akron, Ohio.

The two layer element rather than being held over night was given a 3 minute bake in an oven at 150° C. The initial imagewise exposure through the positive circuit line image was at an 8 unit setting. The initial toning was with Cerac ® copper powder as described in Example 2. The control element of this example after initial toning was baked for 3 minutes in an oven at 150° C. before being washed with wet towels; whereas the element of the invention was baked at 150° C. for 3 minutes after wet towel wash. The via exposure of the elements was for 30 units. The elements were developed on Riston ® Model B Processor manufactured by E. I. du Pont de Nemours and Company, Inc., Wilmington, DE. The two layer element of the invention gave improved background and line resolution and definition over the control element.

EXAMPLE 4

A double-sided copper printed circuit board described in Example 1 is laminated with two photosensitive layers of the following compositions at the lamination conditions for the lower photosensitive layer described in Example 1.

| Ingredient | Bottom Layer Amount (%) |
| --- | --- |
| Methyl methacrylate/butadiene/styrene terpolymer described in Ex. 3 | 10.20 |
| Rubber [3% carboxy-modified acrylonitrile(27)/butadiene(73)], high molecular weight, average Mooney viscosity is 45 | 10.60 |
| Di-(3-acryloxy-2-hydroxypropyl)-ether of bisphenol-A | 42.30 |
| Trimethylolpropane triacrylate | 2.20 |
| Methyl methacrylate resin[1] | 4.30 |
| Michler's ketone | 0.03 |
| 4-chlorobenzophenone | 3.97 |

-continued

| Bottom Layer | |
|---|---|
| Ingredient | Amount (%) |
| Harwick #71 Clay described in Ex. 3 | 26.40 |

[1] Polymer medium molecular weight range, inherent viscosity of 0.45 when 0.25 g polymer is dissolved in 50 ml chloroform, measured at 25° C. using a No. 50 Cannon-Fenske viscometer, specific gravity (25°/25° C.) of 1.15, glass transition temp. is 87° C., Tukon hardness (Knoop No.) is 17, acid No. is 0, sold under the trademark Elvacite ® 2009 Methyl Methacrylate Resins, E. I. du Pont de Nemours and Company, Wilmington, DE.

| Upper Layer | |
|---|---|
| Methyl methacrylate resin[1] | 31.9 |
| Di-(3-acryloxy-2-hydroxypropyl)-ether of bisphenol-A | 51.6 |
| Trimethylolpropane triacrylate | 10.0 |
| 2-(stilbyl-4")-(naptho-1",2":4,5)-1,2,3-triazole-2"-sulfonic acid phenyl ester | 2.2 |
| 2-Mercaptobenzoxazole | 1.5 |
| 4-chlorobenzophenone | 2.0 |
| Michler's ketone | 0.1 |
| Polyethylene oxide[2] | |

[1] polymer high molecular weight range, inherent viscosity 1.20 when 0.25 g polymer is dissolved in 50 ml chloroform, measured at 25° C. using a No. 50 Cannon-Fenske viscometer; glass transition temperature is 95° C., Tukon hardness,Knoop No. 19, typical viscosity in toluene, mPa · s (cP) at 25° C. (% solids) is 1,400 (17.5%).

[2] water soluble resin having a weight average molecular weight of about 400,000 and a viscosity range at 25° C. of 2,250-3,350 (5% solution) using a Brookfield viscometer Spindle No. 1 at 2 rpm commercially available as Polyox ®WSRN 3000, Union Carbide Corp., New York, NY.

The laminate described above is exposed through a positive circuit line image for 6 seconds using a Tamarack ®152R Exposure Unit, a 1000-watt collimated mercury arc source. After removal of the polyethylene terephthalate film, the exposed laminate is toned with copper powder and the excess removed as described in Example 1. The copper toned element is exposed through a via target in register with the toned image for 60 seconds with the exposure device described above. The exposed element is then developed, toned with copper powder, excess copper powder removed, cured with ultraviolet radiation, baked in an oven, treated and electrolessly plated, all as described in Example 1.

The two layer element of the invention is substantially free of extraneous plating giving good fine line resolution.

I claim:

1. A process for preparing two layer printed circuits having conductive interconnections which comprises
    (a) laminating simultaneously or sequentially to a substrate bearing a circuit pattern two photopolymerizable layers, a tacky lower layer (1), 0.0005 to 0.010 inch (0.013 to 0.254 mm) in thickness, formulated for bulk response comprising an elastomeric polymeric binding having a Tg of −10° C. or lower, an ethylenically unsaturated monomeric compound, and a photinitiator or photoinitiator system, and a tacky upper layer (2) thinner than lower layer (1) and having a maximum thickness of 0.0005 inch (0.013 mm), tacky upper layer (2) formulated for surface response having an optical density in the range of 0.3 to 1.5 in at least a portion of the actinic spectral region, comprising a nonelastomeric polymer binder, an ethylenically unsaturated monomeric compound which is the same or different from the monomeric compound in layer (1), and a photoinitiator or photoinitiator system which is the same or different from the photoinitiator or photoinitiator system in lower layer (1);
    (b) exposing the laminate to actinic radiation through a registered circuit image which is related to the underlying circuit pattern having at least one segment thereof overlying at least one segment of the conductive circuit pattern wherein the unexposed areas of upper layer (2) remain tacky and the exposed areas of upper layer (2) become nontacky;
    (c) embedding finely divided metal, alloy, or plating catalyst to the unexposed areas;
    (d) optionally heating the metallized or catalyzed laminate;
    (e) exposing the metallized or catalyzed laminate to actinic radiation through a registered via image of at least one overlying segment of the conductive circuit pattern;
    (f) removing the unexposed areas of the photopolymerizable layers with a solvent therefor to form vias through layers (1) and (2), the sides of the vias corresponding to exposed layer (1) remaining tacky, whereby segments of the underlying circuit patterns are uncovered;
    (g) embedding finely divided metal, alloy or plating catalyst material to the vias, the metal or catalyst being embedded into the sides of the vias;
    (h) optionally curing the laminate by exposing the laminate to actinic radiation, and/or heating;
    (i) plating electrolessly the metallized or catalyzed vias, the uncovered segments, and overlying circuit image to form an electrically conductive circuit pattern interconnected with electrically conductive vias.

2. A process according to claim 1 wherein the substrate bears an electrically conductive surface.

3. A process according to claim 1 wherein steps (a) to (i) are repeated at least once using the newly plated circuit pattern in step (i) for the succeeding process step (a).

4. A process according to claim 1 wherein step (d) is included and the metallized or catalyzed laminate is heated to a temperature up to 100° C.

5. A process according to claim 1 wherein the finely divided material is a metal powder, 1.0 to 250 μm in average diameter.

6. A process according to claim 5 wherein the metal powder is copper or a copper alloy.

7. A process according to claim 1 wherein after step (g) the metallized or catalyzed laminate is cured by heating to a temperature up to at least 150° C.

8. A process according to claim 1 wherein after step (g) the metallized or catalyzed laminate is cured by exposing the laminate overall to actinic radiation.

9. A process according to claim 1 wherein the ratio of thickness of the lower layer (1) to the upper layer (2) is at least 2 to 1.

* * * * *